(12) United States Patent
Feiweier et al.

(10) Patent No.: US 7,078,901 B2
(45) Date of Patent: Jul. 18, 2006

(54) METHOD AND MAGNETIC RESONANCE SYSTEM FOR HOMOGENIZING THE $B_1$ FIELD

(75) Inventors: Thorsten Feiweier, Poxdorf (DE); Razvan Lazar, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 11/084,421

(22) Filed: Mar. 18, 2005

(65) Prior Publication Data
US 2005/0231203 A1    Oct. 20, 2005

(30) Foreign Application Priority Data
Mar. 18, 2004  (DE) .................. 10 2004 013 422

(51) Int. Cl.
*G01V 3/00* (2006.01)
(52) U.S. Cl. ...................... 324/318; 324/320
(58) Field of Classification Search .............. 324/318, 324/320, 322
See application file for complete search history.

(56) References Cited

U.S. PATENT DOCUMENTS

| | | | |
|---|---|---|---|
| 6,400,154 B1* | 6/2002 | Tomanek et al. | 324/318 |
| 6,982,554 B1* | 1/2006 | Kurpad et al. | 324/318 |
| 6,989,673 B1* | 1/2006 | Zhu | 324/318 |
| 2003/0184293 A1 | 10/2003 | Boskamp et al. | |
| 2005/0140369 A1* | 6/2005 | Feiweier et al. | 324/318 |

FOREIGN PATENT DOCUMENTS

WO    WO 02/095453    11/2002

OTHER PUBLICATIONS

Manipulation of Signal Intensity Distribution with Dielectric Loading 7.0T, Yang et al., Proc. Intl. Soc. Mag. Reson. Med. 9 (2001) p. 1096.

* cited by examiner

*Primary Examiner*—Louis M. Arana
(74) *Attorney, Agent, or Firm*—Schiff Hardin LLP

(57) ABSTRACT

In a method and magnetic resonance system for homogenization of the $B_1$ field for a magnetic resonance data acquisition with a number of iteration steps. An iteration step includes the following sub-steps: Measurement data are acquired that represent a $B_1$ field distribution in at least one part of the examination volume of the magnetic resonance system. A $B_1$ homogeneity analysis based on the acquired measurement data is automatically implemented. A specific homogenization action is automatically selected from among a number of possible homogenization actions based on the $B_1$ homogeneity analysis, or the iterative homogenization method is ended if the diagnosed homogeneity is sufficient for an intended magnetic resonance measurement. The selected homogenization action is implemented.

23 Claims, 4 Drawing Sheets

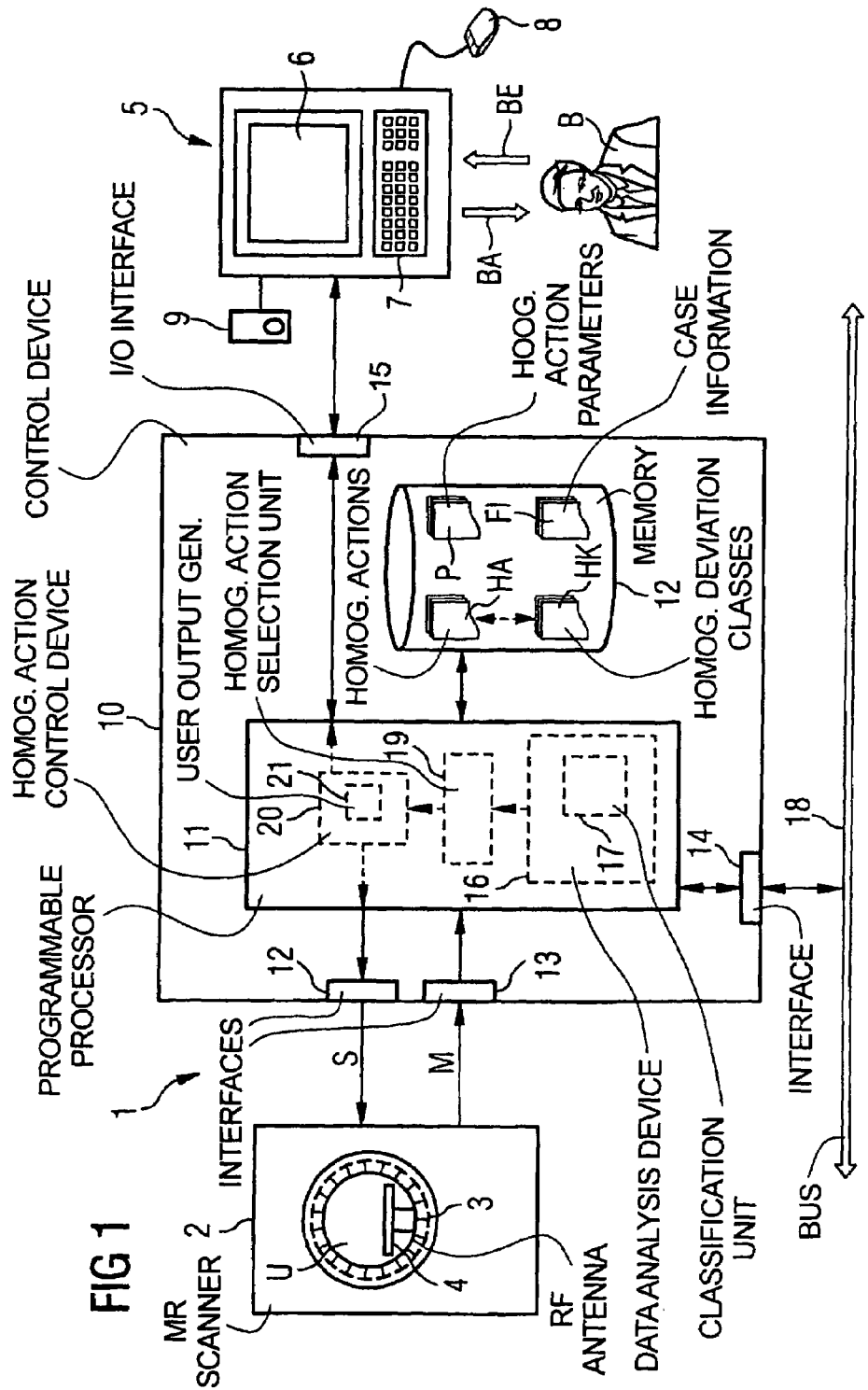

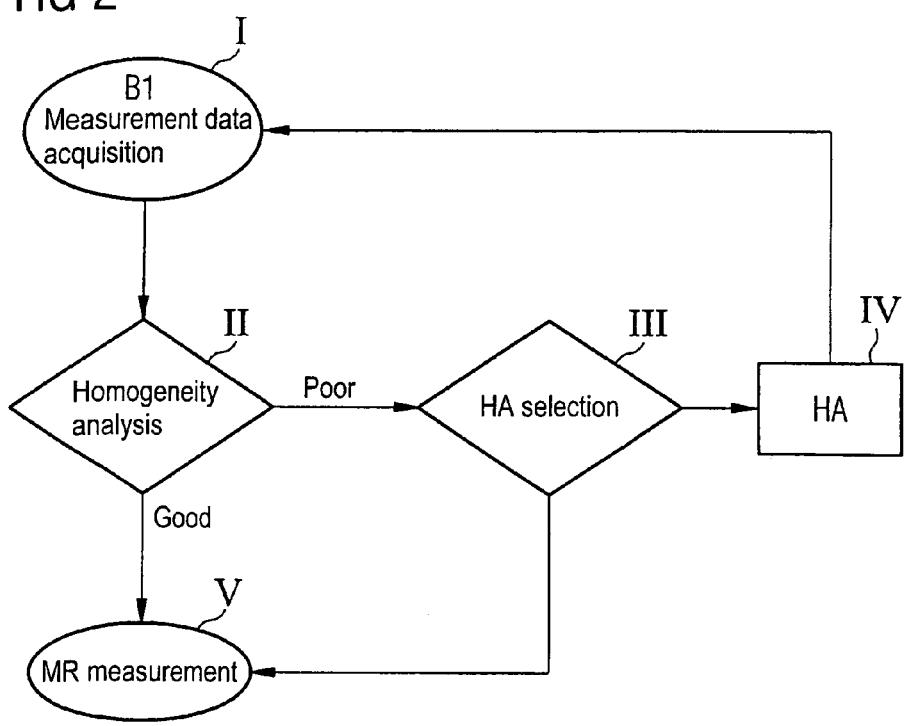

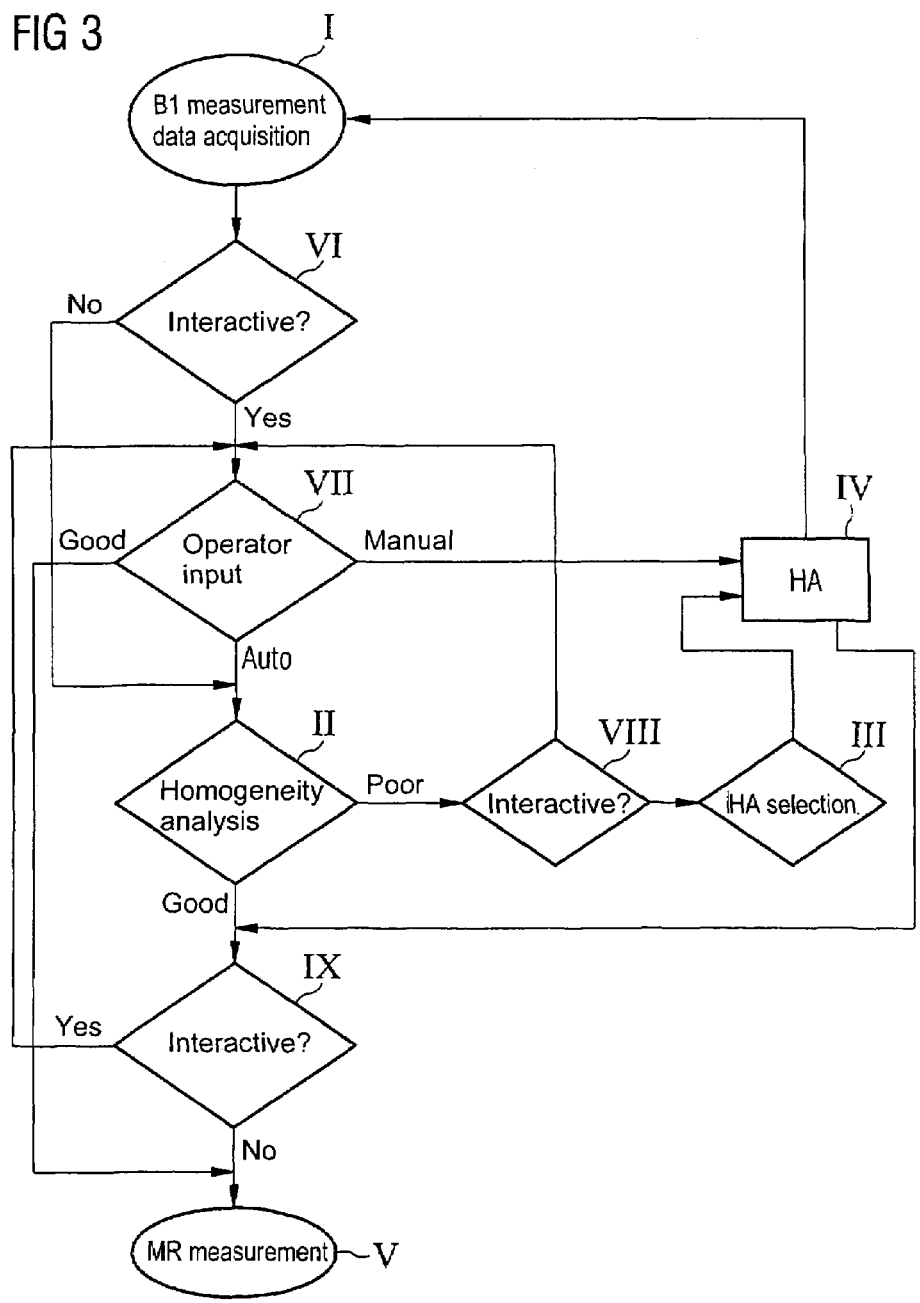

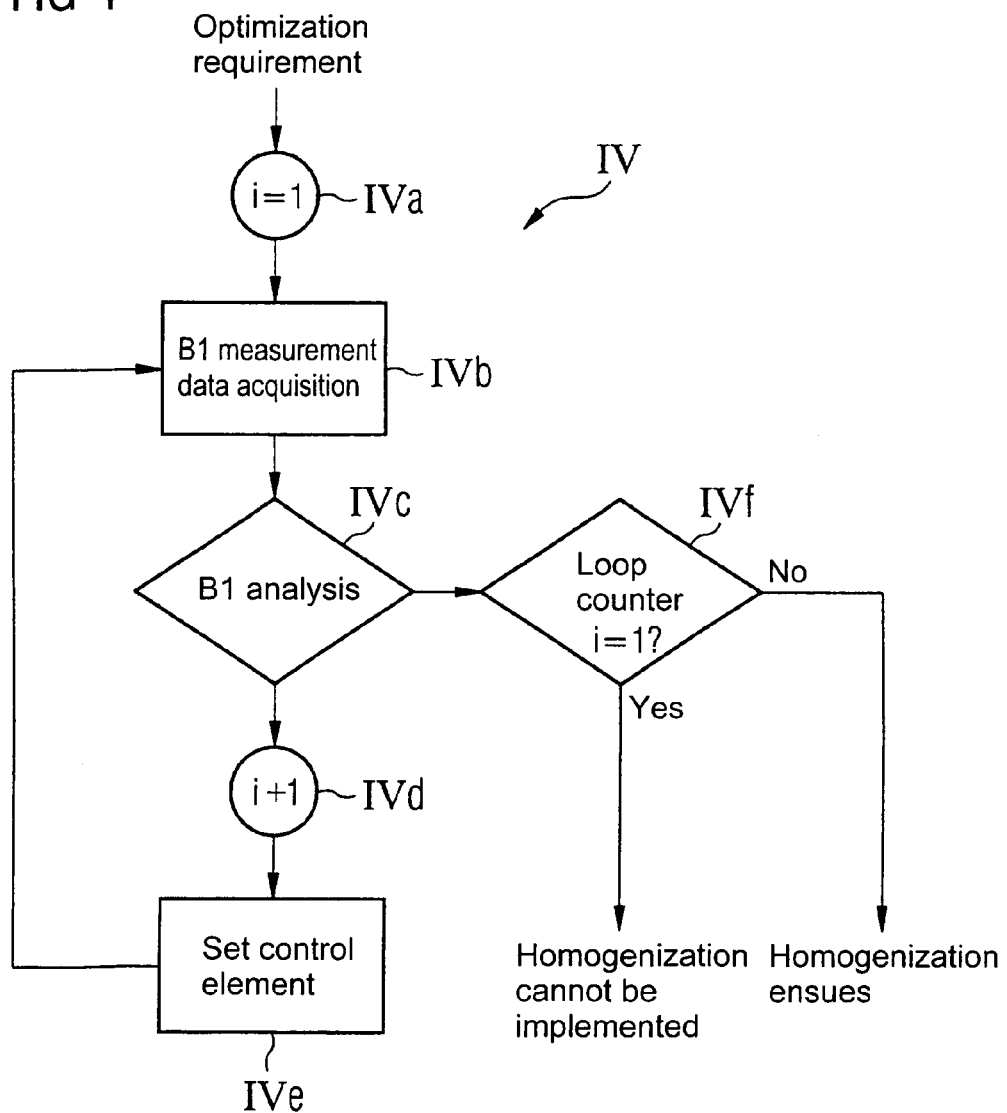

METHOD AND MAGNETIC RESONANCE SYSTEM FOR HOMOGENIZING THE $B_1$ FIELD

BACKGROUND OF THE INVENTION

1. Field of the Invention

The present invention concerns a method for homogenization of the $B_1$ field for a magnetic resonance data acquisition in at least one specific region of an examination volume in the magnetic resonance system. The invention concerns a corresponding magnetic resonance system with which such a method can be implemented.

2. Description of the Prior Art

Magnetic resonance tomography has become a widespread technique for the acquisition of images of the inside of the body of a living examination subject. In order to acquire an image with this modality the body or a body part of the patient to be examined must initially be exposed to an optimally homogenous static basic magnetic field (usually designated as the $B_0$ field), which is generated by a basic field magnet of the magnetic resonance measurement device. During the acquisition of the magnetic resonance images, rapidly switched gradient fields that are generated by gradient coils are superimposed on this basic magnetic field for spatial coding of the magnetic resonance signals. With a radio-frequency antenna, RF pulses of a defined field strength are radiated into the examination volume in which the examination subject is located. The magnetic flux density of these RF pulses typically is designated $B_1$. The pulse-shaped radio-frequency field therefore is generally called a $B_1$ field for short. By means of these RF pulses, the nuclear spins of the atoms in the examination subject are excited such that they are moved from their state of equilibrium, which was parallel to the basic magnetic field $B_0$, by what is known as an "excitation flip angle (called "flip angle" in the following). The nuclear spins then precess in the direction of the basic magnetic field $B_0$. The magnetic resonance signals thereby generated are acquired by radio-frequency receiving antennas. The receiving antennas can be either the same antennas with which the RF pulses were radiated, or separate receiving antennas. The magnetic resonance images of the examination subject are ultimately created based on the received magnetic resonance signals. Each image point in the magnetic resonance image is associated with a small body volume, known as a "voxel", and the brightness or intensity value of each image point is linked with the signal amplitude of the magnetic resonance signal received from this voxel. The relationship between a resonant radiated RF pulse with a field strength $B_1$ and the flip angle a produced thereby is given by the equation $$\alpha = \int_{t=0}^{\tau} \gamma \cdot B_1(t) \cdot dt \quad (1)$$

wherein $\gamma$ is the gyromagnetic ratio that can be considered as a fixed material constant for most magnetic resonance examinations, and $\tau$ is the effective duration of the radio-frequency pulse. The flip angle achieved by an emitted RF pulse, and thus the strength of the magnetic resonance signal, consequently also depends on (aside from the duration of the RF pulse) the strength of the radiated $B_1$ field. Spatial fluctuations in the field strength of the excited $B_1$ field therefore lead to an inhomogeneous irradiation of the examined volume and correspondingly—depending on the complexity of the imaging sequence used—to an insufficient image quality. This can cause certain MR procedure, such as functional imaging or spectroscopy to be impossible.

Given high magnetic field strengths—that are inevitably present due to the necessary magnetic base field $B_0$ in a magnetic resonance tomograph—the RF pulses disadvantageously exhibit an inhomogeneous penetration behavior in conductive and dielectric media such as, for example, tissue. This leads to the $B_1$ field being able to significantly vary within the measurement volume. This effect becomes stronger with increasing $B_0$ field strength and with higher frequencies of the $B_1$ field.

The use of conventional methods for construction and tuning of RF antennas in typical magnetic resonance systems with $B_1$ field strengths of one to two Tesla essentially effect only a homogenization of the antenna profile of the unloaded antenna. This means that the distorting influence of the human body on the $B_1$ field is not taken into account. There exist static methods that optimize the homogeneity of the RF antenna dependent on the load situation, but these must not and cannot be adapted in operation. In modern magnetic resonance systems with high basic magnetic field strength of three Tesla (known as ultra high-field magnetic resonance examinations), however, it is no longer sufficient to ensure only that the unloaded RF antenna generates a homogenous $B_1$ field. Rather, the $B_1$ field must be "pre-distorted" in a suitable manner in order to obtain an optimally homogenous irradiation in the case of loading by a body (or body part) to be examined.

Recently, various technical and physical measures have become known in order to at least partially restore the homogeneity of the $B_1$ distribution in specific regions of the human body given high-field magnetic resonance examinations. For example, in Proc. Intl. Soc. Mag. Reson. Med. 9 (2001) 1096 it is proposed by Yang et al. to compensate distortions of the $B_1$ field in the body of the patient with by using pillows filled with water and positioned on the patient.

A further promising approach is specified in German OS 101 24 465. In this document, a transmission and reception coil for MR apparatuses is specified which is composed of a number of individual antenna elements (resonator segments) that are arranged around the examination volume within a gradient tube. These antenna elements are interconnected to form a large-surface volume antenna, similar to a type of antenna known as a birdcage antenna. The individual antenna elements are electromagnetically decoupled from one another by interconnected capacitors. A separate transmission channel via which the radio frequency feed ensues is associated with each antenna element. Phase and amplitude thus can be individually predetermined for each antenna element. In principle, this enables a complete monitoring of the radio-frequency field distribution in the examination volume (known as "RF shimming"). It is proposed to improve the homogeneity of the RF field in the entire examination volume in this manner.

A very similar method is specified in U.S. Application Publication No. 2003/0184293. In this document it is also proposed to assemble the antenna from similar, separately activatable elements and to improve the homogeneity of the RF field in the entire examination volume by a corresponding activation of the individual antenna elements.

As explained above, however, the $B_1$ inhomogeneities trace back in large part to anatomically-dependent properties of the body to be examined. Consequently, the occurence is individual and position-dependent. Thus the goal of the homogenization is posed differently from case to case. Moreover, the known methods cited above have no general validity, such that they are not applicable in each of the cases. The selection of the matching methods for homogenization of the $B_1$ field in a specific situation case requires from the operator of the magnetic resonance system a significant degree of experience and specialized knowledge, both in a physical respect and in a biological or medical respect, and is additionally extremely time-consuming since often a number of homogenization attempts are necessary until a homogeneity sufficient for a subsequent magnetic resonance examination is finally achieved. This increases the total examination time, which primarily also leads to a higher exposure of the patient.

SUMMARY OF THE INVENTION

An object of the present invention to provide a method for homogenization of a $B_1$ field for a magnetic resonance data acquisition, with which method a sufficient homogenization of the $B_1$ field can be achieved in a fast and safe manner, even by operating personnel who are less experienced with regard to this problem. Moreover, it is an object of the present invention to provide a corresponding magnetic resonance system with which this method can be implemented.

This object is achieved by a method and system according to the invention wherein, to homogenize the $B_1$ field for a magnetic resonance measurement in the examination volume or in a specific sub-region of the examination volume such as, for example, the "field of view" (FoV) or a "region of interest" (RoI) as a subset of the FoV, a number of iteration steps are implemented. An iteration step thereby includes the following sub-steps:

Initially measurement data are acquired which represent a $B_1$ distribution in at least the appertaining part of the examination volume of the magnetic resonance system. This can ensue, for example, with a special, spatially-resolved $B_1$ field distribution measurement. In principle, however, this can also occur by the acquisition of a "normal" magnetic resonance image. The primary attribute is that conclusions can be made about the $B_1$ field distribution using the measurement data.

An automatic implementation of a $B_1$ homogeneity analysis then ensues in a further sub-step based on the acquired measurement data. For example, the homogeneity is evaluated according to predetermined evaluation algorithms. The term "$B_1$ homogeneity analysis" is equivalent to "$B_1$ inhomogeneity analysis". Depending on the measurement data, additional information can be relied on. For example, given an analysis of an MR test image to detect the $B_1$ field distribution, spatially-resolved patterns (templates) of the human body, known shadowing regions, etc. can be drawn from a databank in order to arrive at an analysis result.

An automatic selection of a specific homogenization action from a number of possible homogenization actions subsequently ensues based on the $B_1$ homogeneity analysis. Alternatively, the iterative homogenization method is ended, i.e. the desired magnetic resonance measurement is immediately started, if the diagnosed homogeneity is sufficient for this magnetic resonance measurement.

Insofar as a suitable homogenization action is selected, the implementation of the selected homogenization action then ensues in a next step.

In order to prevent the method from requiring an unnecessarily large amount of time, the method preferably is interrupted if no further homogenization measures with a prospect of success are available. Moreover, the method can also be interrupted after exceeding a specific time duration limit.

It is clear that the iterative method can already end after only a first iteration step, insofar as it has emerged that the homogeneity is sufficient or no further homogenization is possible. However, normally a number of iteration steps are necessary. Nevertheless, a good homogenization can be achieved relatively quickly with the inventive method. The method is not based on a specific manner of homogenization, but instead allows the method most suitable for the respective individual case to be selected from a number of different homogenization actions, with the goal of achieving a homogenization sufficient for the subsequent measurement in the fastest way. The method in principle can operate independently of the individual experience and the prior knowledge of the operating personnel.

To implement the method, an inventive magnetic resonance system initially requires a measurement arrangement to acquire measurement data that represent the $B_1$ field distribution in at least one part of an examination volume of the magnetic resonance system. This can be a device for special measurement of the spatially-resolved $B_1$ distribution within the region of interest. However, since information about the $B_1$ distribution can also be acquired using suitable magnetic resonance images, the measuring arrangement can be the typical means to create magnetic resonance images. The inventive magnetic resonance system additionally requires a measurement data analysis device to implement the $B_1$ homogeneity analysis based on the acquired measurement data, as well as a homogenization action selection device to select a specific homogenization action from among a number of possible homogenization actions, based on the homogeneity analysis, and a unit to abort (interrupt) the iterative homogenization method when an established homogeneity is sufficient for a provided magnetic resonance measurement. Furthermore, the magnetic resonance system requires a homogenization action control device to implement the selected homogenization action.

As already mentioned, the required measurement data that represent the $B_1$ field distribution in the part of the examination volume of the magnetic resonance system to be homogenized can be acquired in different manners. Such measurement data, for example, can be acquired with $B_1$-sensitive measurement sequences that supply a largely spatially-resolved $B_1$ distribution independent of the anatomical structure of the examined region.

In a special method for spatially-resolved measurement of the $B_1$ field distribution, a sequence known as a "double echo radio-frequency pulse sequence" is emitted via the radio-frequency antenna with a first excitation pulse and two refocusing pulses to generate a first and second echo. This means that, initially, a first radio-frequency excitation pulse is emitted that tilts the nuclear spin, for example, by a flip angle $\alpha_1$. After a specific time a second pulse (known as a "refocusing pulse") subsequently ensues that leads to a further tilting by $2\cdot\alpha_1$. After measurement of the first echo (known as the spin echo), a further $\alpha_1$-refocusing pulse is emitted and a second echo (known as the stimulated echo) is measured. The following applies for the amplitudes of the measured spin-echo signal $A_{SE}$ and for the measured stimulated echo signal $A_{STE}$, dependent on the flip angle $\alpha_1$:

$$A_{SE} = e^{i\phi} \sin^3(\alpha_1) \quad (2a)$$

$$A_{STE} = e^{i\phi} \sin^3(\alpha_1)\cos(\alpha_1) \quad (2b)$$

wherein $\phi$ designates the phase position of the echo signal. The flip angle $\alpha_1$ achieved with such a pulse sequence consequently can be determined by the relation $$\cos\alpha_1 = \frac{A_{STE}}{A_{SE}} \quad (3)$$

from the ratio of the amplitudes of both echo signals.

In order to be able to measure (acquire) the measurement data with spatial resolution, in this method at least the excitation pulse is slice-selectively emitted; preferably only the excitation pulse but not the refocusing pulses is slice-selectively emitted. A first echo image and a second echo image are then measured with spatial resolution by the emission of the matching gradient pulses in the excitation layer established by means of the excitation pulse. Such a "spatially-resolved" measurement of the echo images is possible with a method in which initially both echoes are measured under a readout gradient by sampling the time curve multiple times, with m data points with n different amplitudes of the phase coding gradient. The result of this measurement is then a data matrix with m columns and n rows for each of the echoes, i.e. the spin echo and the stimulated echo in the time domain (also called "k-space").

This matrix is individually, two-dimensionally Fourier-transformed for each echo. A real two-dimensional image with k·l pixels is thereby obtained for each echo, with m=n=k=l generally being set. The local flip angles at the appertaining locations are then measured using the ratio of the amplitudes of the first and second echo images at various locations, i.e. for each individual image pixel. The flip angles spatially resolved within the slice, i.e. a flip angle distribution, consequently can be determined via such a measurement. The flip angle measured at a specific location is in turn representative for the $B_1$ field radiated at the appertaining location, with the dependency being given by equation (1). This means that any flip angle distribution can be converted into a $B_1$ field distribution and vice versa using this equation (given knowledge of the pulse used). A determination of a flip angle distribution thus can be considered as the equivalent of a determination of the corresponding $B_1$ field distribution in the sense of the discussion herein.

In addition to the just-described method, any other suitable method for spatially-resolved measurement of the $B_1$ field distribution alternatively can be used.

Another, relatively simple method to acquire measurement data that represent the $B_1$ field distribution is to acquire a proton density-weighted magnetic resonance image. Such a proton density-weighted magnetic resonance image can be generated by using long repetition times and short echo times in the measurement sequence, such that the $T_1$ and $T_2$ relaxation times play no role. In such a proton density-weighted image, the various tissue types appear approximately the same. Therefore these images exhibit only a very low contrast. Moreover, residual structures such as edges and small details can be extracted by low-pass filtering. Stronger deviations in the structures within the filtered image therefore indicate inhomogeneities in the $B_1$ field. This method has been used as a "pre-scan" in previous normalization methods. The method can be implemented without great effort.

However, in principle magnetic resonance images acquired in a different manner could also be used in order to make conclusions about the homogeneity of the $B_1$ field. In particular it is also possible to directly use images acquired within the actual magnetic resonance measurement itself. Although the images will exhibit a poor quality and therefore may be rejected by the operator, they are suitable for a first analysis of the $B_1$ field and to implement a $B_1$ homogeneity analysis based on these measurement data.

Furthermore, the same method does not have to be used in each iteration step in order to acquire the measurement data for the subsequent $B_1$ homogeneity analysis; rather, different methods can be used in different iteration steps. Thus, for example, in a first step a faulty magnetic resonance image can be used in order to implement a first $B_1$ homogeneity analysis. Based on the implemented homogeneity analysis, it can ultimately be established that more detailed information about the $B_1$ field is necessary in the framework of a specific homogenization action, such that then a more elaborate spatially-resolved $B_1$ field distribution measurement is correspondingly implemented.

The automatic homogeneity analysis implemented on the basis of this measurement data should preferably includes a determination of a degree of homogeneity (or degree of inhomogeneity) and/or an expansion and/or the position of determined homogeneity deviations. Such a degree of homogeneity in the simplest case can be the statement "good homogeneity" or "poor homogeneity".

The system preferably operates with a quantified $B_1$ homogeneity measure in order to determine a more precise homogeneity value as a degree of homogeneity, i.e. to evaluate the $B_1$ field. The iterative homogenization method is ended when the homogeneity established in the homogeneity analysis reaches or exceeds a specific homogeneity limit value, which likewise has been established corresponding to the quantified homogeneity measure.

There are various possibilities for implementation of such a method.

One possibility is to implement a relative analysis. For this purpose, a (possibly weighted) $B_1$ average value is initially determined, insofar as data from a spatially-resolved $B_1$ field distribution measurement are available as measurement data. A maximum allowable deviation value $\epsilon$ is then established that, for example, may correspond to 20% of the determined $B_1$ average value. Insofar as the local $B_1$ field present at a specific location, i.e. in a specific voxel, deviates from the $B_1$ average value by more than this value $\epsilon$, homogenization in a suitable manner is necessary. Otherwise the homogeneity is sufficient and the iterative homogenization method is ended.

A relative analysis also can be implemented in a similar manner with a magnetic resonance image, in particular with the already-described proton density-weighted magnetic resonance image. For this, after the low-pass filtering of the image an intensity average value can be determined, and then it is checked whether, at a specific location, the intensity deviates from the intensity average value by an established value $\epsilon$.

Alternatively, an absolute analysis can be implemented in which a desired value for the $B_1$ field, or the intensity, is initially established, and then for each location it is determined whether the $B_1$ field or the intensity deviates from the desired $B_1$ value or in the desired intensity value.

Limit values for the local and/or global specific absorption rate (SAR) of the examination subject also can be considered here. A more significant heating of the body occurs in particular given the use of strong basic magnetic fields and the relatively high frequencies of the $B_1$ field used therewith due to the higher energy input associated therewith. Such an increased energy input cannot be arbitrarily high, either locally with regard to the examination volume or globally with regard to the entire examination subject. Rather, in the framework of the magnetic resonance examination, limit values are used in order to avoid such overheating in the patient. Since the specific absorption rate is dependent on the strength of the $B_1$ field, in the analysis matching $B_1$ limit values or intensity limit values can also be established that take into account the SAR, such that the subsequent selection of the homogenization action also ensues based on the allowable SAR values.

The homogeneity analysis preferably includes an automatic creation of a $B_1$ inhomogeneity diagnosis. This means that not only is it established that an inhomogeneity is actually present and in which region or to what extent this exists, but also the cause of the respective inhomogeneity is determined in order to make the correct selection for the subsequent homogenization action. The term "$B_1$ inhomogeneity diagnosis" is thereby equivalent to the term "$B_1$ homogeneity diagnosis".

The homogeneity analysis preferably includes a classification of the determined homogeneity deviations in predetermined homogeneity deviation classes, i.e. the "inhomogeneity type" is established. The inventive magnetic resonance system preferably has a corresponding classification unit for this purpose.

Specific homogenization deviation classes preferably are associated with specific homogenization actions. The selection of the homogenization action then can ensue based on the classification of the determined homogeneity deviations. This means that the established inhomogeneities are automatically classified within the inventive method and associated with a predefined class of known inhomogeneity cases, for which there is a prepared, complete homogenization solution.

For this it is necessary that the magnetic resonance system have a storage device with a number of possible homogenization actions that are associated with specific homogenization deviation classes.

In order to be able to create a suitable $B_1$ inhomogeneity diagnosis with the homogeneity analysis, or to appropriately classify the established inhomogeneity, further information normally is needed. This information is normally available to a sufficient degree in the magnetic resonance system. Thus typical information about gender, age, size and weight of the examined patient are known to the MR system from the patient registration file. Moreover, the current patient position be can normally determined from the measurement context. Overall, an inhomogeneity analysis or diagnosis can be effected from this information that initially offers a standard solution for the homogenization task, starting from already stored, known solution sets. For this purpose, the inventive magnetic resonance system preferably has a databank in which all necessary information is contained in a discrete, hierarchically-structured form, such that the data can be retrieved as quickly as possible for an inhomogeneity diagnosis.

The manner by which a homogenization action is implemented depends on the selected homogenization action. The homogenization action is controlled by the homogenization control device.

In many cases the action is a homogenization action that can be implemented by an appropriate setting or adjustment of the parameters of the various components of the magnetic resonance system. Thus, for example, specific mutually-oscillating antenna structures are switched in order to achieve a specific $B_1$ field "pre-distortion". Changes in the $B_1$ field likewise can be achieved by adjustment of the measurement sequence parameters.

Moreover, there are also techniques such as, for example, variation of the dielectric environment of the body by means of water pillows or other dielectric elements that require an intervention by the operating personnel. Therefore the implementation of the homogenization action preferably also includes an automatic output of information and/or instructions via a user interface. This means that it is precisely predetermined for the operator as to how and at which location the operator has to position which dielectric elements. For this purpose, the homogenization action control device preferably has an output device, for example a prompt generation unit and/or a suitable dialog control in order to generate the desired information and/or instructions, and to output them via a user interface of the magnetic resonance system.

Moreover, given the selection of a specific homogenization action based on the inhomogeneity analysis with the aid of the additional information, specific parameters preferably are also established that are to be used in the implementation of a specifically selected homogenization action. These parameters, for example, can be pre-distortion factors to be adjusted, or the precise measurement sequence parameters to be set, or can be specifications about the pillow size or about specific types of dielectric pillows to be used, as well as the precise positioning data, in order to achieve a more homogenous $B_1$ field in a subsequent measurement.

In a preferred exemplary embodiment, the selection of a specific homogenization action ensues by taking into account homogenization actions already implemented in preceding iteration steps and/or homogenization methods as well as, if applicable, by taking into account the parameters thereby used. This means that the inventive magnetic resonance system is adaptive (learning-capable) as an "expert system" and uses the experiences of preceding homogenization actions and the effects thereby achieved with specific parameters for the selection and definition of homogenization actions in subsequent situations.

For this purpose it is necessary that the magnetic resonance system have a storage device to store information about a homogenization action implemented in an iteration step and, if applicable, to store the parameters thereby used. The storage of such data preferably ensues in a suitably structured databank, such that in similar cases the associated data can be quickly accessed.

In principle, the inventive system can be fashioned such that the homogenization method proceeds completely automatically. Nevertheless, it is advantageous to design the system flexibly and to allow various intervention possibilities for the operator in the inventive method process, such that the operator can use this system semi-automatically or, if applicable, can shift into a type of manual mode.

To allow this, the acquired measurement data preferably are output via a user interface before the automatic creation of a $B_1$ inhomogeneity diagnosis—if applicable after a request by the user. Dependent on a user input, the $B_1$ homogeneity analysis can then be automatically implemented based on the acquired measurement data or a specific homogenization action can be directly implemented if, for example, the user has already decided (using the acquired measurement data) which homogenization action should be implemented. Likewise, also dependent on the user input, the iterative homogenization method can be ended and the subsequent magnetic resonance measurement immediately started.

Alternatively, after implementation of an automatic $B_1$ homogeneity analysis—if applicable again after a request by the user—the analysis result or the diagnosis can be output via the user interface and then, dependent on the user input, a specific homogenization action can be implemented or the iterative homogenization method can be ended. At this point, incidentally, using the user input it can also be established that first a homogenization action should be automatically selected because the user, using the analysis result, cannot or does not want to decide on a homogenization action, but rather would prefer to switch back into the "automatic mode".

For this purpose, the inventive magnetic resonance system has a user interface for output of the acquired measurement data and/or an analysis result as well as for acquisition of a user input. An "acquisition" of the user input in this sense encompasses at least one analysis or interpretation of the user input, from which it is recognized whether an automatic creation of a $B_1$ homogeneity analysis should be started based on the user input, whether a homogenization action should be selected, whether a specific homogenization action should be implemented or whether, possibly, the iterative homogenization method should be ended.

The components necessary for incorporation of the invention into a magnetic resonance system, such as the measurement data analysis device, the homogenization action selection device, the homogenization action control device, the output device, the classification unit, etc., can be created predominantly in the form of software components. Typical magnetic resonance systems comprise programmable control devices anyway, so the invention preferably is realized in this manner by suitable control software. This means that a corresponding computer program product is loaded directly into the memory of a programmable control device of the appertaining magnetic resonance system, the computer program product including program code in order to implement the inventive method.

Realization as software has the advantage that existing magnetic resonance systems can be retrofitted at any time in a simple manner in order to use the inventive method.

DESCRIPTION OF THE DRAWINGS

FIG. 1 is a schematic illustration of an inventive magnetic resonance system.

FIG. 2 is a simple flowchart showing the principle of the inventive homogenization method in the most general case.

FIG. 3 is a flowchart for an exemplary embodiment of an inventive method process allowing interactive intervention by an operator.

FIG. 4 is a flowchart showing an embodiment of a specific homogenization procedure within the method according to FIG. 3.

DESCRIPTION OF THE PREFERRED EMBODIMENTS

FIG. 1 shows an exemplary embodiment of a magnetic resonance system 1 with which an implementation of the inventive method is possible. This magnetic resonance examination system 1 has a scanner 2 in which a patient is positioned on a bed 4 in an annular basic field magnet (not shown). A radio-frequency antenna 3 for emission of the RF pulses into an examination volume U around the patient is located within the basic field magnet.

In this exemplary embodiment, the radio-frequency antenna 3 is formed by a number of antenna elements that can be individually activated via separate transmission channels. The design can correspond, for example, to the design cited in German OS 101 24 465. Apart from the special design of the antenna 3 and the necessary components for separate activation of the individual antenna elements, the scanner 2 can be conventional. Since widely varied homogenization actions can be used within the inventive method, the method in principle can be used with conventional scanners that exhibit no such special antenna construction.

The scanner 2 is operated by a control device 10, which here is shown separately. A terminal 5, via which an operator B operates the control device 10 and with it the scanner 2, is connected as a user interface to the control device 10 via an I/O interface 15. In a typical manner, this terminal has a screen 6, a keyboard 7 and a pointer device 8 for a graphical user interface, for example a mouse 8. Moreover, the user interface 5 can have a speaker for output of audio signals such a warning signals, etc.

The control device 10 is here connected with the scanner 2 via interfaces 12, 13. Both the control device 10 and the terminal 5, however, can be integral components of the scanner 2.

An interface 14 serves for connection of the magnetic resonance system 1 to a communication network, for example an image information system, via a bus 18. The magnetic resonance system 1 also includes all further components, or exhibits all features, of a typical magnetic resonance system. These typical components are not shown in FIG. 1 for clarity.

The control device 10 controls the scanner 2 via the interface 12 in order, for example, to provide for the emission of the desired radio-frequency pulse sequences by the antenna 3 and to switch the gradients in a suitable manner in order to implement a specific MR measurement. The raw image data from the scanner 2 are acquired via the interface 13 and from the images are reconstructed in the control device 10. The images then can be shown on the screen 6 of the terminal 5 and/or stored in a memory (not shown).

The necessary units for operation of the scanner 2 and for raw image data evaluation and image reconstruction preferably are realized in the form of software modules (not shown) in a programmable processor 11 of the control device. The memory alternatively can be an external mass storage to which the control device 10 has access, for example via a network.

Various forms of measurement data M, which represent the $B_1$ field distribution of the RF field emitted by the antenna 3, can be acquired with the typical components for raw image data acquisition. Thus control commands S can be transferred to the tomograph 2, in particular by the control device 10, such that the scanner, for example, emits the previously-described double-echo radio-frequency pulse sequence or other sequences for measurement of the $B_1$ field distribution. The measurement data M thereby acquired are subsequently accepted by the control device 10 via the interface 13.

In the shown magnetic resonance system 1, the control device 10 includes the subsequently-specified components, likewise realized in the form of software modules in the programmable processor 11.

A significant component is a measurement data analysis device 16 which help a $B_1$ homogeneity analysis of the RF field emitted by the antenna 3 can initially ensue based on the acquired measurement data M. This includes a determination, based on the measurement data M, of the spatially-resolved $B_1$ field distribution for each individual antenna element. The measurement data analysis device 16 includes as a sub-module, a classification unit 17 that, in the homogeneity analysis, classifies the determined homogeneity deviations into homogeneity deviation classes HK. Corresponding homogeneity deviation classes HK are stored in a memory 12 of the control device 10 that the processor 11 can access.

This memory 12 alternatively can be an external memory or a storage region in an external memory to which the control device 10 has access. A further component is a homogenization action selection device 19. Based on the homogeneity analysis, this selects a specific homogenization action HA from a number of possible homogenization actions HA. The various prefabricated solutions for implementation of a homogenization action HA are likewise stored the memory 12. They are thereby associated with various homogeneity deviation classes HK.

Since the measurement data analysis device 16 also transfers the homogeneity deviation classes HK to the homogenization action selection device 19 as an analysis result, the homogenization action selection device 19 can simply select the correct homogenization action HA dependent on the association between the homogeneity deviation classes HK and the prefabricated solutions for various homogenization methods, i.e. the homogenization actions HA.

Also stored in the memory 12 are various parameters P that are in turn associated with various homogenization actions HA and that are preferably to be used given the various homogenization actions HA.

Furthermore, another databank with various case information FI is included in (or is connected to) the memory 12, from which databank details about the gender, the age, the size and the weight of the examined patient can be determined, as well as the current patient position resulting from the measurement context. Such data can be used by the homogeneity analysis device 16 in order to create a sufficient inhomogeneity diagnosis, or in the establishment of inhomogeneities. The data also can be used by the homogenization action selection device 19 in order to make an optimal selection of the homogenization action HA dependent on this case information.

Insofar as a homogenization is established that is sufficient for a subsequent measurement, the homogenization method can be ended and the desired measurement can be started. This either can be established by the analysis device 16 or can be established by the homogenization action selection device 19.

As soon as a homogenization action HA has been selected, a homogenization action control device 20 causes the homogenization action HA to be implemented in the correct manner.

For this purpose, the homogenization action control device 20 can access the appertaining components of the tomograph 2 via the interface 12 in order to set the optimal parameters and thus to generate an optimally homogenized $B_1$ field.

Moreover, the homogenization action control device 20 also has a user output generator 21 that generates commands and/or information for the operator regarding homogenization measures to be implemented. The user outputs BA thus generated can be output to the operator B via the terminal 5 either in optical form, for example via the display 6, or also in acoustic form via the speaker 9. The operator B can then react corresponding to the instructions and, for example in the framework of the homogenization action HA, manually position a dielectric element at the appropriate location within the examination volume U.

FIG. 2 shows a very simplified example for an iteration loop according to the inventive method. The method normally first begins in method step I with a $B_1$ measurement data acquisition. A homogeneity analysis subsequently ensues in method step II. In the simplest case, here it is simply decided—for example via comparison with limit values—whether the homogeneity is or is not sufficient for the subsequent measurement. If the system comes to the decision that the determined homogeneity is too poor, an appropriate homogenization action HA is selected in the method step III. The selected homogenization action is then implemented in the method step IV. A new $B_1$ measurement data acquisition subsequently ensues in the method step I as well as a subsequent new homogeneity analysis in the method step II, etc. This method is implemented until the homogeneity is sufficient good. Alternatively, ending of the method is possible when, given the selection in step III, it is established that a suitable homogenization method is not (no longer) available. In both cases, the implementation of the desired magnetic resonance measurement normally ensues in the method step V.

In a rough schematic in FIG. 3, a somewhat more elaborate method is shown that allows an interactive intervention of the operator in the method process.

Here the method normally likewise begins first with a $B_1$ measurement data acquisition in step I. However, a query to an operator as to whether the further method should be implemented interactively or automatically subsequently first ensues in method step VI.

This query VI ensues in the form of a user output BA to the operator B, who can react with a user input BE. The operator B, for example, can enter the user input BE by means of the keyboard 7 or also with the aid of a corresponding mouse click (see FIG. 1), insofar as the user output ensues via a graphical user interface on the display 6. Alternatively, a user output BA is possible as a speech dialog via the speaker 9 and a user input BE via a microphone or headset (not shown).

An output of the acquired $B_1$ measurement data also can ensue in the method step VI with the query as to whether the operator wants to interactively proceed with the method, such that the operator B can make a decision with knowledge of this data.

If the operator B decides on a further interactive proceeding, in the subsequently method step VII the operator can manually select a specific homogenization action HA which is then executed in the method step IV. Likewise, however, the operator can decide, based on the $B_1$ measurement data specified to him, that a sufficient homogenization exists, and in this case the MR measurement starts immediately in the method step V. The third possibility is that the operator can still decide on the automatic creation of a homogeneity analysis. This then ensues in the method step II.

As shown in FIG. 3, the possibility to immediately have the automatic homogeneity analysis created in the method step II exists for the operator by declining the inquiry regarding an interactive intervention in the first query in the method step VI.

If, given the creation of the homogeneity analysis in the next method step II, the homogeneity is too poor, a query as to whether the operator would like to interactively intervene in the method first ensues again in the method step VII, whereby here the diagnosis of the homogeneity analysis from the method step II is advantageously presented to the operator. If the operator decides on an interactive intervention, a return to the method step VII ensues, such that the operator again receives the opportunity to abort the method or to select a suitable homogenization action HA.

If, in the method step VII, the operator decides against an interactive intervention, an automatic selection of the homogenization action HA ensues in the method step III, which homogenization action HA is then implemented in the method step IV.

The homogenization action HA is then implemented in method step IV. After the homogenization action, the method is again continued in the next iteration step with the sub-step I, in that new $B_1$ measurement data are acquired.

In some cases, a homogenization or a further homogenization may not be possible even after a number of already-implemented iteration steps. In this case, initially the method step IX is introduced given establishment of a sufficient homogeneity in method step II, in which method step IX the operator is asked whether the operator wants to interactively intervene in the method. If the operator declines this, ultimately the MR measurement is implemented in step V, independently of whether the method has been aborted because a sufficient homogeneity has been achieved or because no improvement of the homogeneity can be achieved. This is preferably indicated in the last query IX to the operator, or an appropriate warning signal is output in the case of an insufficient homogeneity.

Schematically shown in FIG. 4 is the possibility for a homogenization action HA that is based on adjustment of specific control elements (actuating elements), for example change-over switches for coupling in resonating local coils for distortion of the $B_1$ field. The method begins with the optimization requirement that (for example starting from method step VII in FIG. 3) can ensue manually or via an automatic selection in the method step VIII.

A loop counter is then first set to i=1 in a first method step IVa. A $B_1$ measurement data acquisition subsequently ensues in method step IVb. Given the first pass of the shown iteration loop, the $B_1$ measurement data acquisition can be omitted in the method step IVb is suitable $B_1$ measurement data have already been acquired in method step I in the superordinate loop according to FIG. 3.

A $B_1$ field analysis then subsequently ensues in the method step IVc, in which it is again established whether the $B_1$ measurement values are sufficiently homogenous. In the method step IVd, the loop counter is subsequently incremented by a value, and in the method step IVe the necessary control elements are correspondingly set, such that the $B_1$ field distribution should become more homogenous.

A new $B_1$ measurement data acquisition subsequently ensues again in method step IVb and a further $B_1$ field analysis ensues in the method step IVc. This method is implemented until a sufficient $B_1$ homogeneity is achieved.

In the method step IVf, it is subsequently checked whether the loop counter amounts to i=1. If this is the case, this means that, within the homogenization action HA in the method step IV, no control elements whatsoever have been switched, i.e. no homogenization has been implemented or that no improvement of the homogenization was also achievable with this measure. This corresponds to the case that, in FIG. 3, the process jumps from method step IV directly to method step IX. Otherwise, a jump back to the method step I in FIG. 3 ensues after a homogenization has occurred.

A homogenization action HA, which is shown in FIG. 3 as a block, can likewise be designed (as in FIG. 4) in the form of an iterative loop in the inventive manner. This loop also can be implemented fully automatically without an interactive intervention being possible. The individual switch-over actions in the method step IVe can also be understood as homogenization actions in the sense of the invention.

Alternatively, a number of other homogenization measures can be implemented such as, for example, the variation of the dielectric environment of the body by means of water elements or other dielectric bodies. Likewise the dielectric environment of the body can also be automatically modified with the aid of elements with chamber structures, in which targeted, specific chambers are flooded or emptied, or anisotropic dielectric solid bodies can be specifically oriented. Furthermore, as described above, a specific activation of segmented antenna structures or the adjustment of specific measurement sequence parameters is possible in order to achieve an optimized $B_1$ field.

The entire homogenization method can be initiated fully automatically when, given an image acquisition in a planned magnetic resonance measurement, it is established that the image brightness is insufficient or an inhomogeneous image or unwanted shadowing exists. This can ensue in the framework of an automatic image analysis, but the operator can likewise detect an insufficient image brightness, an inhomogeneous image or a shadowing and thus start the method. If the homogenization method is initiated in this manner, the corresponding image can first be subjected to an automatic homogeneity analysis, i.e. in the first method step the $B_1$ measurement data acquisition can be foregone, since even the faulty magnetic resonance image already contains measurement data that represent the $B_1$ field in a specific manner. If the error that has led to the inhomogeneity of the $B_1$ field can already be identified in this first analysis, a solution proposal can be presented to the operator or the necessary homogenization action HA can be automatically implemented. In this case, the method is already successful after one iteration step. Otherwise, in further iteration steps corresponding continuing $B_1$ field distributions or other measurement data can be acquired in order to then implement further homogenization actions based on these measurement data.

If a homogenization is successfully concluded, all data preferably are stored for further use and can form, for example, a base and/or an information databank for a neural network or a system known as a KI system (artificial intelligence) or an adaptive expert system. If the homogenization is not successful, the iteration is continued or other alternative homogenization methods are used in the framework of the iteration.

It should again be noted that the method stops specified in detail as well as the shown magnetic resonance system are exemplary embodiments which can be modified in various manners by those skilled in the art without depending from the scope of the invention. Although the invention has been specified in the example of magnetic resonance apparatuses in the medical field, the usage possibilities of the invention are not limited to this field. The invention likewise can be employed in magnetic resonance apparatuses used for scientific and/or industrial purposes.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for homogenizing a $B_1$ field, for magnetic resonance data acquisition in a magnetic resonance system, in at least one region of an examination volume in said magnetic resonance system, comprising a plurality of iteration steps, with each iteration step comprising the steps of:

acquiring measurement data representing a $B_1$ field distribution in said region of said examination volume;

based on said measurement data, automatically analyzing a homogeneity of said $B_1$ field;

dependent on the analysis of said homogeneity, automatically selecting a homogenization action from among a plurality of available homogenization actions, or ending said iteration steps if said homogeneity is sufficient for acquiring said magnetic resonance data; and if a homogenization action has been selected, implementing the selected homogenization action.

2. A method as claimed in claim 1 comprising analyzing said homogeneity by automatically making a determination selected from the group consisting of a degree of homogeneity, an expansion of said measurement, and a position of determined homogeneity deviations.

3. A method as claimed in claim 1 comprising, in analyzing said homogeneity, including an automatic creation of a $B_1$ inhomogeneity diagnosis.

4. A method as claimed in claim 1 comprising, in analyzing said homogeneity, classifying determined homogeneity deviations in predetermined homogeneity deviation classes.

5. A method as claimed in claim 4 comprising associating specific homogenization actions, in said plurality of available homogenization actions, respectively with said homogeneity deviation classes, and selecting for implementation the homogenization action that is associated with the homogeneity deviation class in which homogeneity deviations, determined from said measurement data, are classified.

6. A method as claimed in claim 1 comprising automatically determining parameters for implementing the selected homogenization action in said homogeneity analysis after selecting the selected homogenization action.

7. A method as claimed in claim 1 wherein said magnetic resonance system includes a user interface, and wherein the step of implementing the selected homogenization action includes automatically generating an output, via said user interface, selected from the group consisting of information relating to the selected homogenization action and instructions associated with implementation of the selected homogenization action.

8. A method as claimed in claim 1 comprising ending said iteration steps when a homogeneity of said $B_1$ field in said analysis of said homogeneity reaches or exceeds a predetermined homogeneity limit value.

9. A method as claimed in claim 1 wherein said magnetic resonance system includes a user interface, and comprising:

presenting said measurement data as an output via said user interface; and receiving a user input via said user interface and, dependent on said user input, performing one of automatically implementing a $B_1$ homogeneity analysis, implementing a specific homogenization action from among said plurality of available homogenization actions, and ending said iteration steps.

10. A method as claimed in claim 1 wherein said magnetic resonance system includes a user interface, and comprising:

after automatically analyzing said $B_1$ homogeneity, making an analysis result available via said user interface; and allowing entry of a user input via said user interface and, dependent on said user input, performing one of selecting a homogenization action from among said plurality of available homogenization actions, implementing a specific homogenization action from among said plurality of available homogenization actions, and ending said iteration steps.

11. A method as claimed in claim 1 comprising selecting said homogenization action from among said plurality of available homogenization actions dependent on selected homogenization actions that have been implemented in preceding iterations of said iteration steps.

12. A magnetic resonance system for homogenizing a $B_1$ field, for magnetic resonance data acquisition in the magnetic resonance system, in at least one region of an examination volume in the magnetic resonance system, comprising:

a measurement device for acquiring measurement data representing a $B_1$ field distribution in said region of said examination volume;

a computer;

a control unit for operating said measurement device and said computer in an iterative procedure comprising a plurality of iterative steps including acquiring said measurement data and, in said computer, based on said measurement data, automatically analyzing a homogeneity of said $B_1$ field, and dependent on the analysis of said homogeneity, automatically selecting a homogenization action from among a plurality of available homogenization actions, or ending said iteration procedure if said homogeneity is sufficient for acquiring said magnetic resonance data; and if a homogenization action has been selected, said computer instructing said control unit for implementing the selected homogenization action.

13. A magnetic resonance system as claimed in claim 12 wherein said computer analyzes said homogeneity by automatically making a determination selected from the group consisting of a degree of homogeneity, an expansion of said measurement, and a position of determined homogeneity deviations.

14. A magnetic resonance system as claimed in claim 12 wherein said computer, in analyzing said homogeneity, automatically creates a $B_1$ inhomogeneity diagnosis.

15. A magnetic resonance system as claimed in claim 12 wherein said computer, in analyzing said homogeneity, classifies determined homogeneity deviations in predetermined homogeneity deviation classes.

16. A magnetic resonance system as claimed in claim 15 wherein said computer associates specific homogenization actions, in said plurality of available homogenization actions, respectively with said homogeneity deviation classes, and selects for implementation the homogenization action that is associated with the homogeneity deviation class in which homogeneity deviations, determined from said measurement data, are classified.

17. A magnetic resonance system as claimed in claim 12 wherein said computer automatically determines parameters for implementing the selected homogenization action in said homogeneity analysis after selecting the selected homogenization action.

18. A magnetic resonance system as claimed in claim 12 comprising a user interface, and wherein said computer, for implementing the selected homogenization action automatically generates an output, via said user interface, selected from the group consisting of information relating to the selected homogenization action and instructions associated with implementation of the selected homogenization action.

19. A magnetic resonance system as claimed in claim 12 wherein said computer ends said iteration steps when a homogeneity of said $B_1$ field in said analysis of said homogeneity reaches or exceeds a predetermined homogeneity limit value.

20. A magnetic resonance system as claimed in claim 12 comprising a user interface, and wherein said computer presents said measurement data as an output via said user interface and receives a user input via said user interface and, dependent on said user input, performs one of automatically implementing a $B_1$ homogeneity analysis, instructing said control unit to implement a specific homogenization action from among said plurality of available homogenization actions, and ending said iteration steps.

21. A magnetic resonance system as claimed in claim 12 comprising a user interface, and wherein said computer, after automatically analyzing said $B_1$ homogeneity, makes an analysis result available via said user interface; and allows entry of a user input via said user interface and, dependent on said user input, performs one of selecting a homogenization action from among said plurality of available homogenization actions, instructing said control unit to implement a specific homogenization action from among said plurality of available homogenization actions, and ending said iteration steps.

22. A magnetic resonance system as claimed in claim 12 wherein said computer selects said homogenization action from among said plurality of available homogenization actions dependent on selected homogenization actions that have been implemented in preceding iterations of said iteration procedure.

23. A computer program product loadable into a computer of a magnetic resonance system for homogenizing a $B_1$ field, for magnetic resonance data acquisition in the magnetic resonance system, in at least one region of an examination volume in the magnetic resonance system, said computer program product causing said computer to execute a plurality of iteration steps, and in each iteration step:
- causing a measuring device of said magnetic resonance system to acquire measurement data representing a $B_1$ field distribution in said region of said examination volume;
- causing said computer, based on said measurement data, to automatically analyze a homogeneity of said $B_1$ field;
- causing said computer, dependent on the analysis of said homogeneity, to automatically select a homogenization action from among a plurality of available homogenization actions, or to end said iteration procedure if said homogeneity is sufficient for acquiring said magnetic resonance data; and
- if a homogenization action has been selected, causing said computer to instruct a control unit of the magnetic resonance system to implement the selected homogenization action.

* * * * *